United States Patent
Dohiwa et al.

(10) Patent No.: US 7,587,300 B2
(45) Date of Patent: Sep. 8, 2009

(54) PARTS MANAGEMENT SYSTEM AND METHOD AND PARTS MANAGEMENT PROGRAM AND STORAGE MEDIUM

(75) Inventors: Mitsuru Dohiwa, Nirasaki (JP); Kazushi Tahara, Nirasaki (JP); Hiroshi Nishikawa, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 1202 days.

(21) Appl. No.: 10/733,273

(22) Filed: Dec. 12, 2003

(65) Prior Publication Data

US 2004/0193437 A1 Sep. 30, 2004

(30) Foreign Application Priority Data

Dec. 12, 2002 (JP) .............................. 2002-361205
Dec. 9, 2003 (JP) .............................. 2003-410485

(51) Int. Cl.
*G06F 17/00* (2006.01)
*G06Q 10/00* (2006.01)

(52) U.S. Cl. ..................... 702/184; 702/188; 700/121; 705/28; 707/10

(58) Field of Classification Search .................. 700/79, 700/80, 121; 702/176, 183–188; 705/28, 705/30; 714/25, 37; 707/1, 10
See application file for complete search history.

(56) References Cited

U.S. PATENT DOCUMENTS

| 4,404,641 A | 9/1983 | Bazarnik |
| 5,124,908 A | 6/1992 | Broadbent |
| 5,231,594 A | 7/1993 | Knibiehler et al. |
| 5,329,465 A | 7/1994 | Arcella et al. |
| 5,828,567 A | 10/1998 | Eryurek et al. |
| 6,006,171 A | 12/1999 | Vines et al. |
| 6,219,367 B1 | 4/2001 | Atsumi |
| 6,338,045 B1* | 1/2002 | Pappas ........................ 705/29 |
| 6,408,220 B1* | 6/2002 | Nulman ...................... 700/121 |
| 6,456,894 B1* | 9/2002 | Nulman ...................... 700/121 |
| 6,608,666 B2* | 8/2003 | Deguchi et al. ............... 355/53 |
| 6,618,692 B2* | 9/2003 | Takahashi et al. ........... 702/188 |
| 6,947,161 B2* | 9/2005 | Suyehira ..................... 358/1.15 |
| 2001/0032109 A1 | 10/2001 | Gonyea et al. |
| 2002/0000677 A1 | 1/2002 | Tahara et al. |

FOREIGN PATENT DOCUMENTS

| JP | 3-8407 | 1/1991 |
| JP | 11-272323 | 10/1999 |
| JP | 2000-12412 | 1/2000 |

* cited by examiner

*Primary Examiner*—Andrew Joseph Rudy
(74) *Attorney, Agent, or Firm*—Oblon, Spivak, McClelland, Maier & Neustadt, P.C.

(57) ABSTRACT

A parts management system which is capable of preventing use of a non-conforming part. A first computer for a user has component parts for an apparatus, delivered to the user. A second computer for a manufacturer is connected via a communication network to the first computer, and has a database provided therein which includes a list having fields for a plurality of kinds of management data for the apparatus component parts in association with each of ID numbers of the apparatus component parts. In the second computer, the management data on the apparatus component parts is acquired from the first computer via the communication network, and the acquired management data is compared with management data within the database.

30 Claims, 10 Drawing Sheets

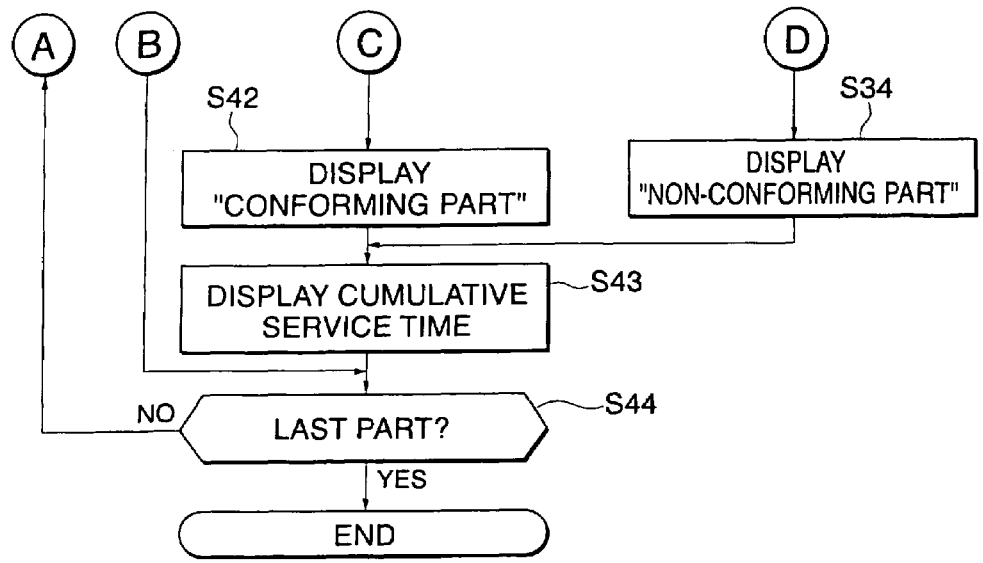

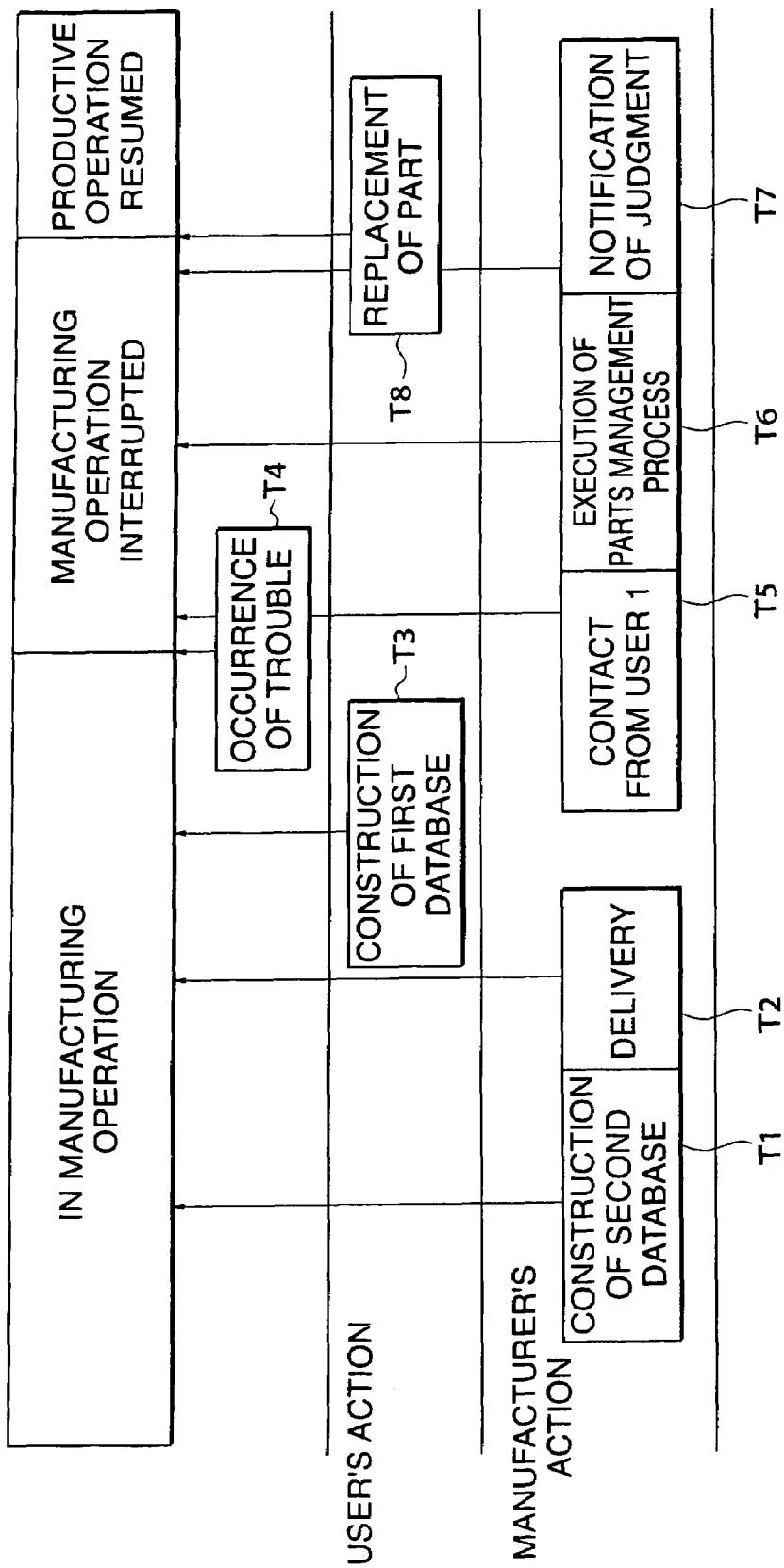

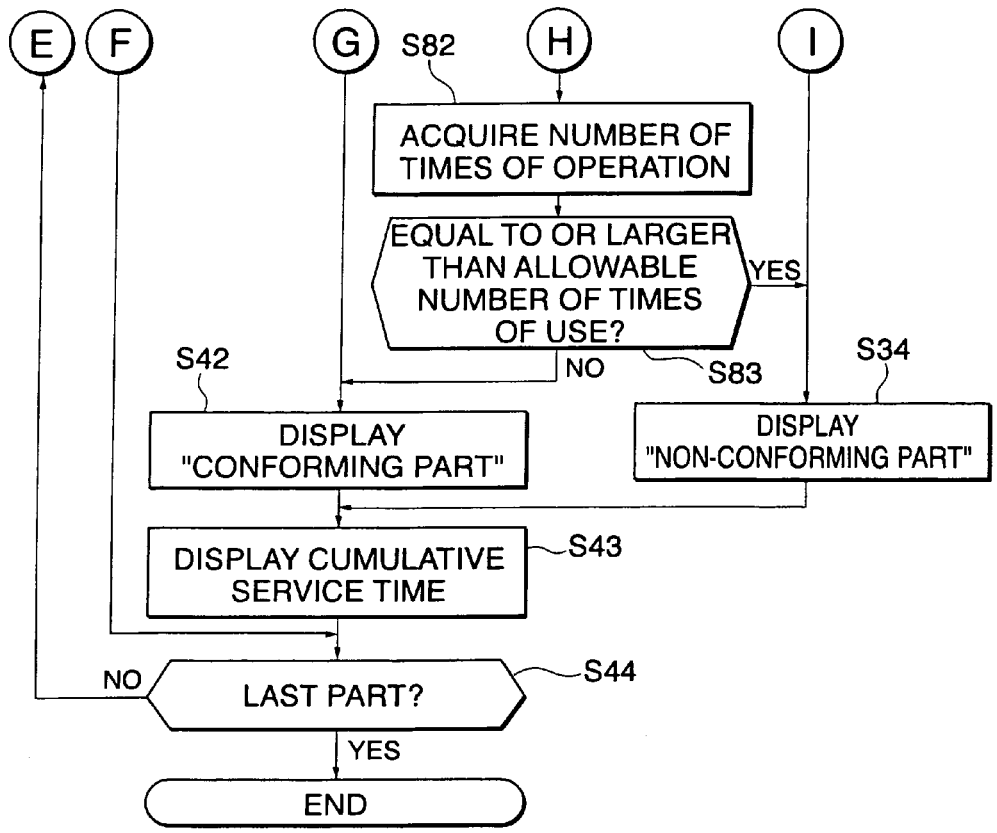

FIG. 9

```
SUBSTRATE PROCESSING
APPARATUS 11              ID11-XXXX-XX
    PART 1                     └── ID11-XX
    PART 2                             └── ID11X
      ⋮                                    ⋮

SUBSTRATE PROCESSING
APPARATUS 12              ID12-XXXX-XX
    PART 1                     └── ID12-XX
    PART 2                             └── ID12X
      ⋮                                    ⋮

SUBSTRATE PROCESSING
APPARATUS 13              ID13-XXXX-XX
    PART 1                     └── ID13-XX
    PART 2                             └── ID13X
      ⋮                                    ⋮
``` ated from the second database via the communication network, and comparison means for comparing the acquired management data with the management data within the database.

PARTS MANAGEMENT SYSTEM AND METHOD AND PARTS MANAGEMENT PROGRAM AND STORAGE MEDIUM

BACKGROUND OF THE INVENTION

1. Field of the Invention

The present invention relates to a parts management system and method as well as a parts management program and a storage medium, and more particularly to a parts management system and method for managing parts of a semiconductor manufacturing apparatus, as well as a program for executing the method and a storage medium storing the program.

2. Description of the Related Art

A substrate processing apparatus, such as a plasma processing apparatus, is manufactured by a manufacturer, and then delivered to a user to be used at a user's site. A plasma processing apparatus as a substrate processing apparatus has various parts used therein. These parts are subjected to attack by plasma and wears, and therefore a user replaces worn parts with new ones during maintenance including cleaning.

A conventional parts management system for managing the parts of a plasma processing apparatus is comprised of a computer main unit including a CPU, a memory, and a hard disk, a keyboard and a display both connected to the computer main unit. In the computer main unit, there is provided a database associated with management of the parts of the plasma processing apparatus.

The user enters e.g. the manufacturer's serial numbers of the parts as management data on the parts via the keyboard to store the management data in the database. The parts management system displays replacement timing and other data for each part, as required, based on the database, thereby performing parts management (see Japanese Laid-Open Patent Publication (Kokai) No. H11-272323).

In another parts management system, a manufacturer's computer connected to a semiconductor processing apparatus, via an internal network, such as a LAN, for example, is connected to a user's computer via an external network, such as the Internet, and the operative state of each part is determined by comparing an amount of actual operation of the part with an allowable limit value of the amount of operation to be obtained when a normal operation is performed, and then ordering of parts or maintenance is performed based on the determination result (see e.g. U.S. patent application Ser. No. 09/893,628).

However, these conventional parts management systems require users to enter management data on numerous parts, and this inconvenience hinders the systems from being operated effectively.

Further, mounting of a non-conforming part, such as a part already used over its service life or a copycat product, as a replacement part, this not only makes it difficult to properly determine timing for replacement of the part, but also has the possibility of adversely affecting the apparatus itself.

Further, a consumable article or the like used in the chamber of a plasma processing apparatus can affect processing, due to production of particles when it is exposed to plasma or subjected to RF electric power application. Therefore, it is very difficult to accurately determine the suitability of such a replacement part.

Furthermore, a consumable article or the like used in the chamber of a thermal processing apparatus or a film deposition apparatus can be influenced by heat of 200 to 1100° C., which also makes it very difficult to accurately determine the suitability of a replacement part.

Moreover, when a user enters a false number as the manufacturer's serial number of a non-conforming part, the apparatus erroneously recognizes the use of the non-conforming part as the use of a conforming part, and therefore it is impossible to prevent the non-conforming part from being used.

SUMMARY OF THE INVENTION

It is an object of the present invention to provide a parts management system and method and a parts management program which are capable of preventing use of a non-conforming part, and a storage medium storing the program.

To attain the above object, in a first aspect of the present invention, there is provided a parts management system comprising a communication network, a first computer for a user, the first computer having management data on component parts for an apparatus, delivered to the user, and a second computer for a manufacturer, the second computer being connected to the first computer via the communication network, and having a database provided therein, the database including a list having fields for a plurality of kinds of management data for the component parts for the apparatus in association with each of ID numbers of the component parts, the second computer comprising acquisition means for acquiring the management data on the component parts for the apparatus from the first computer via the communication network, and comparison means for comparing the acquired management data with the management data within the database.

According to the first aspect of the present invention, the second computer for the manufacturer is connected to the first computer for the user via the communication network and compares management data on the component parts for the apparatus acquired from the first computer with the management data on the database. This makes it possible to perform parts management reliably on the manufacturer side, thereby preventing use of non-conforming parts.

Preferably, the database in the second computer includes at least a part delivery history associated with the parts delivered to the user, as the management data.

Preferably, the first computer has provided therein a second database of the management data on the component parts for the apparatus corresponding to the management data on the database, and the acquisition means acquires the management data from the second database via the communication network.

More preferably, the second database includes a list having fields for a plurality of kinds of management data for the parts in association with each of the ID numbers of the parts.

More preferably, the management data in the second database includes at least one of data items indicative of a part number, a part name, and a mounting date which are associated with each of the parts, and whether or not the part has been discarded.

Preferably, the management data in the database includes at least one of data items indicative of a part name, a manufacturing date, a delivery date, a delivery destination, a service life, and an allowable number of times of use which are associated with each of the parts.

Preferably, each of the second computer and the first computer includes input means for inputting the management data on the parts.

Further preferably, the comparison means comprises first determination means for determining whether or not an ID number of a part acquired from the second database exists in the database, and when the ID number of the part acquired from the second database does not exist in the database, the first determination means determines that the part is a non-conforming part.

With this arrangement, when the ID number of a part acquired from the second database does not exist in the database, the part is determined to be a non-conforming part. As a result, the manufacturer can notice use of a non-conforming part by the user.

Preferably, the comparison means comprises first determination means for determining whether or not an ID number of a part acquired from the second database exists in the database, second determination means for determining whether or not the ID number of the part acquired from the second database is identical to an ID number that has been inputted to the second database, and third determination means for determining whether or not the ID number of the part acquired from the second database is identical to an ID number already discarded in the database, and when the ID number of the part acquired from the second database exists in the database, the ID number is identical to an ID number that has been inputted to the second database, and the ID number is identical to an ID number already discarded in the database, the part is determined to be a non-conforming part.

With this arrangement, when the ID number of the part acquired from the second database exists in the database, the ID number is identical to an ID number that has been inputted to the second database, and the ID number is identical to an ID number already discarded in the database, the second computer determines that the part is a non-conforming part. As a result, the manufacturer can positively notice use of a non-conforming part by the user.

More preferably, the comparison means further comprises fourth determination means for determining whether or not a cumulative service time period of the part acquired from the second database is equal to or longer than a service life of the part, and when the ID number of the part acquired from the second database exists in the database, the ID number is identical to any ID number that has been inputted to the second database, the ID number is not identical to any ID number already discarded in the database, and the cumulative service time period of the part acquired from the second database is equal to or longer than the service life of the part, the part is determined to be a non-conforming part.

With this arrangement, when the ID number of the part acquired from the second database exists in the database, the ID number is identical to an ID number that has been inputted to the second database, the ID number is not identical to any ID number already discarded in the database, and the cumulative service time period of the part acquired from the other database has exceeded the service life of the part, the second computer determines that the part is a non-conforming part. This enables the manufacturer to positively notice use of a non-conforming part by the user.

More preferably, the first computer comprises second acquisition means connected via the communication network to an apparatus having an operation system in which the component parts for the apparatus are used, for acquiring a number of times of operation of the operation system of the apparatus using the parts, and the comparison means comprises fifth determination means for determining whether or not the number of times of operation is equal to or larger than an allowable number of times of use of a part existing in the database, and when the ID number of the part acquired from the second database exists in the database, when the ID number is identical to any ID number that has been inputted to the second database, the ID number is not identical to any ID number already discarded in the database, the cumulative service time period of the part acquired from the second database is not equal to or longer than the service life of the part, and, further the number of times of operation of the part acquired from the second database is equal to or larger than the allowable number of times of use of the part, the part is determined to be a non-conforming part.

With this arrangement, when the ID number of the part acquired from the second database exists in the database, the ID number is identical to any ID number that has been inputted to the second database, the ID number is not identical to any ID number already discarded in the database, the cumulative service time period of the part acquired from the other database is not equal to or longer than the service life of the part, and the number of times of operation of the part acquired from the second database is equal to or larger than the allowable number of times of use of the part, the second computer determines that the part is a non-conforming part. This enables the manufacturer to more positively notice use of a non-conforming part by the user.

More preferably, the first computer acquires the management data on the component parts for the apparatus from an IC or a bar code attached to the part.

More preferably, the apparatus comprises a substrate processing apparatus.

More preferably, the substrate processing apparatus is selected from the group consisting of a plasma processing apparatus, a thermal processing apparatus, a film deposition apparatus, a plasma etching apparatus, an in-line semiconductor processing apparatus, and a multi-chamber semiconductor processing apparatus.

More preferably, the parts management system further comprises a container device connected to the second computer via the communication network, and containing the component parts for the apparatus already delivered to the user, and the container device comprises detection means for detecting that any of the component parts for the apparatus has been taken out from the container device, and transmission means operable when the detection means detects that any of the component parts has been taken out, to transmit an ID number of the taken out part to the second computer.

With this arrangement, when the detection means detects that any of the component parts for the apparatus has been taken out from the container device, the transmission means transmits an ID number of the taken out part to the second computer via the communication network. This enables the user to obtain a component part for the apparatus necessary for replacement, from the container device without delay, and thereby reduce production loss caused by stoppage of the apparatus using the part. Further, this enables the manufacturer to obtain management data on component parts for the apparatus from ID numbers transmitted from the container device, and therefore, it is possible to reduce burdensome operation for constructing the database.

To attain the above object, in a second aspect of the present invention, there is provided a parts management method of performing parts management using a second computer for a manufacturer, the second computer being connected to a first computer for a user, which has management data on component parts for an apparatus delivered to the user, via a communication network, and having a database provided therein, the database including a list having fields for a plurality of kinds of management data for the component parts for the apparatus in association with each of ID numbers of the component parts, the parts management method comprising an acquisition step of acquiring the management data on the component parts for the apparatus from the first computer via the communication network, and a comparison step of comparing the acquired management data with the management data within the database.

To attain the above object, in a third aspect of the present invention, there is provided a parts management program for causing a second computer for a manufacturer to perform a parts management method, the second computer being connected to a first computer for a user, which has management data on component parts for an apparatus, delivered to the user, via a communication network, and having a database provided therein, the database including a list having fields for a plurality of kinds of management data for the component parts for the apparatus in association with each of ID numbers of the component parts for the apparatus, the parts management program comprising an acquisition module for acquiring the management data on the component parts for the apparatus from the first computer via the communication network, and a comparison module for comparing the acquired management data with the management data within the database.

To attain the above object, in a fourth aspect of the present invention, there is provided a computer-readable storage medium storing a parts management program.

The above and other objects, features, and advantages of the present invention will become more apparent from the following detailed description taken in conjunction with the accompanying drawings.

BRIEF DESCRIPTION OF THE DRAWINGS

FIGS. 3A and 3B are flowchart of a part management process executed by a manufacturer-side parts management system appearing in FIG. 1;

FIG. 4 is a diagram showing a judgment table displayed on a manufacturer's display in a step S32 in the part management process in FIGS. 3A and 3B;

FIG. 5 is a diagram showing operation of the parts management system shown in FIG. 1;

FIGS. 7A and 7B are flowchart of a parts management process executed by the parts management system shown in FIG. 6;

FIG. 8 is a diagram showing a judgment table displayed on a manufacturer's display in a step S32 in the parts management process in FIGS. 7A and 7B;

FIG. 9 is a diagram showing a variation of an ID number used by the parts management system shown in FIG. 6.

DETAILED DESCRIPTION OF THE PREFERRED EMBODIMENTS

The present invention will now be described in detail below with reference to the accompanying drawings showing a preferred embodiment thereof.

Figure 1:
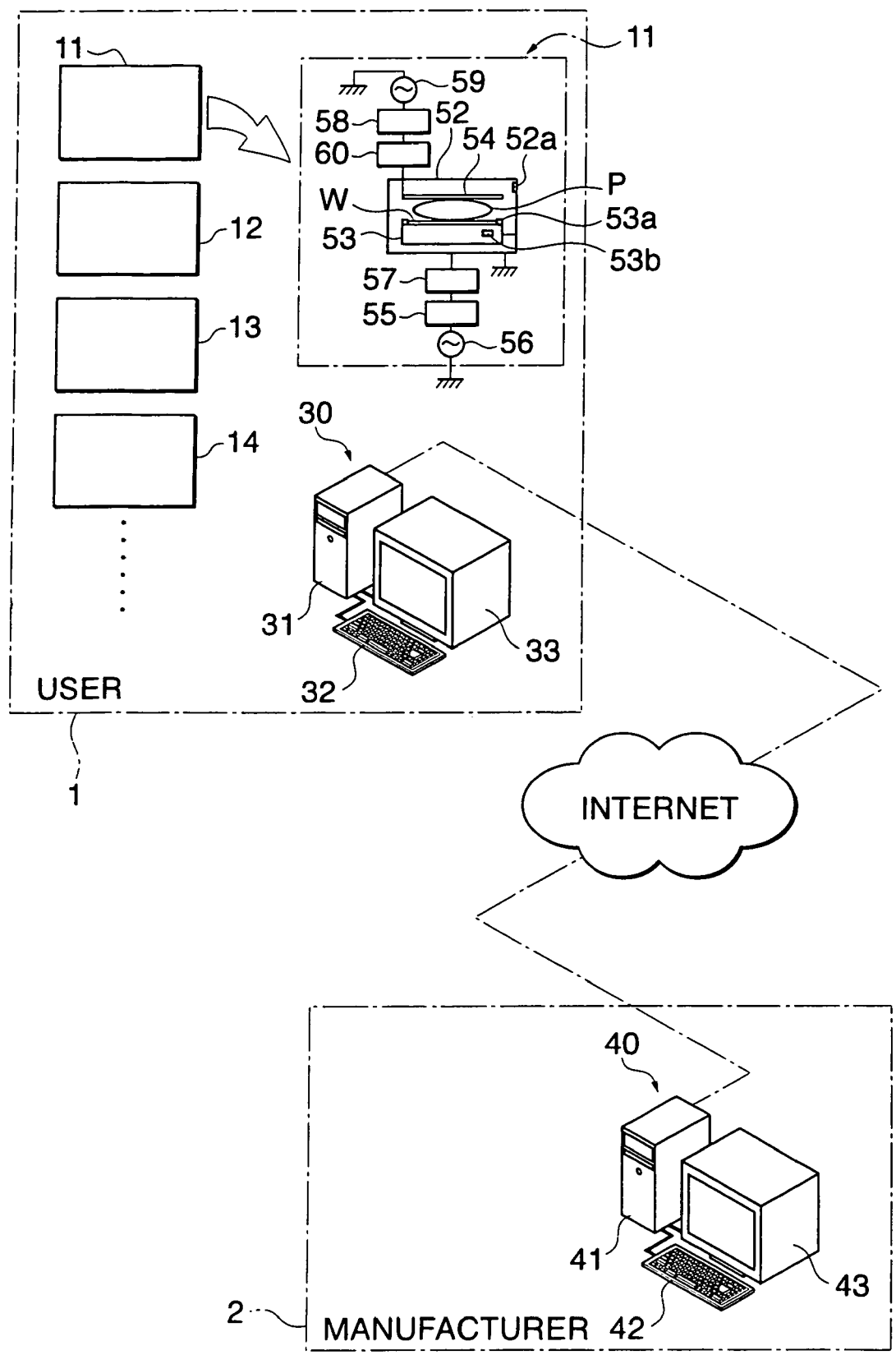
FIG. 1 is a diagram schematically showing the arrangement of a parts management system according to an embodiment of the present invention.

FIG. 1 is a diagram schematically showing the arrangement of a parts management system according to an embodiment of the present invention.

As shown in FIG. 1, a user 1 has a plurality of substrate processing apparatuses 11, 12, 13, 14 . . . , and a single computer 30 (first computer) for managing parts of the substrate processing apparatuses. In FIG. 1, only a plasma processing apparatus 11 as an example of the substrate processing apparatus, is shown in detail. Actually, however, the plurality of substrate processing apparatuses 12, 13, 14, . . . of other types are disposed on the user 1 side. Hereafter, a description will be given of the plasma processing apparatus 11 alone, but it is to be understood that the parts management system described below is also applied to the other substrate processing apparatuses 12, 13, 14 . . . .

On the other hand, a manufacturer 2 of the substrate processing apparatuses has a computer 40 (second computer) connected to the computer 30 via the Internet. The computers 30 and 40 connected to each other via the Internet form a parts management system that manages the parts of the plasma processing apparatus 11.

The computer 30 on the user 1 side is comprised of a computer main unit 31 including a CPU, a memory, and a hard disk, none of which are shown, and a keyboard 32 and a display 33 both connected to the computer main unit 31. Within the computer main unit 31, there is provided a first database for parts management of the plasma processing apparatus 11.

The computer 40 on the manufacturer 2 side is comprised of a computer main unit 41 including a CPU, a memory, and a hard disk, none of which are shown, and connected to the user's computer main unit 31 via the Internet, and a keyboard 42 and a display 43 both connected to the computer main unit 41. Within the computer main unit 41, there is provided a second database for parts management of the plasma processing apparatus 11.

The plasma processing apparatus 11 includes a processing chamber 52 made of a conductive material, such as aluminum, and having an inside thereof held in a high vacuum state for performing etching on a semiconductor wafer W as an object to be treated, a lower electrode 53 disposed in a lower part within the processing chamber 52 and also serving as a table on which a semiconductor wafer W is placed, and an upper electrode 54 disposed above the lower electrode 53 within the processing chamber 52 and also serving as a shower head for supplying a process gas as a mixture of an etching gas and a carrier gas into the processing chamber 52. On the peripheral edge of the top of the lower electrode 53, there is provided a focus ring 53a for focusing plasma P generated within the processing chamber 52 onto the semiconductor wafer W to enhance the efficiency of the plasma processing. At a location radially inward of the focus ring 53a, there is disposed an electrostatic chuck, not shown, for electrostatically attracting the semiconductor wafer W. Further, the processing chamber 52 is provided with a pressure sensor 52a for detecting pressure within the processing chamber 52. The lower electrode 53 is supplied with electric power from a high-frequency power supply 56 via a matching device 55 and an electrical measurement device 57, while the upper electrode 54 is supplied with electric power from a high-frequency power supply 59 via a matching device 58 and an electrical measurement device 60.

The parts management system on the manufacturer 2 side performs a parts management process, which will be described hereinafter with reference to FIGS. 3A and 3B, on each part used in the plasma processing apparatus 11.

Figure 2:
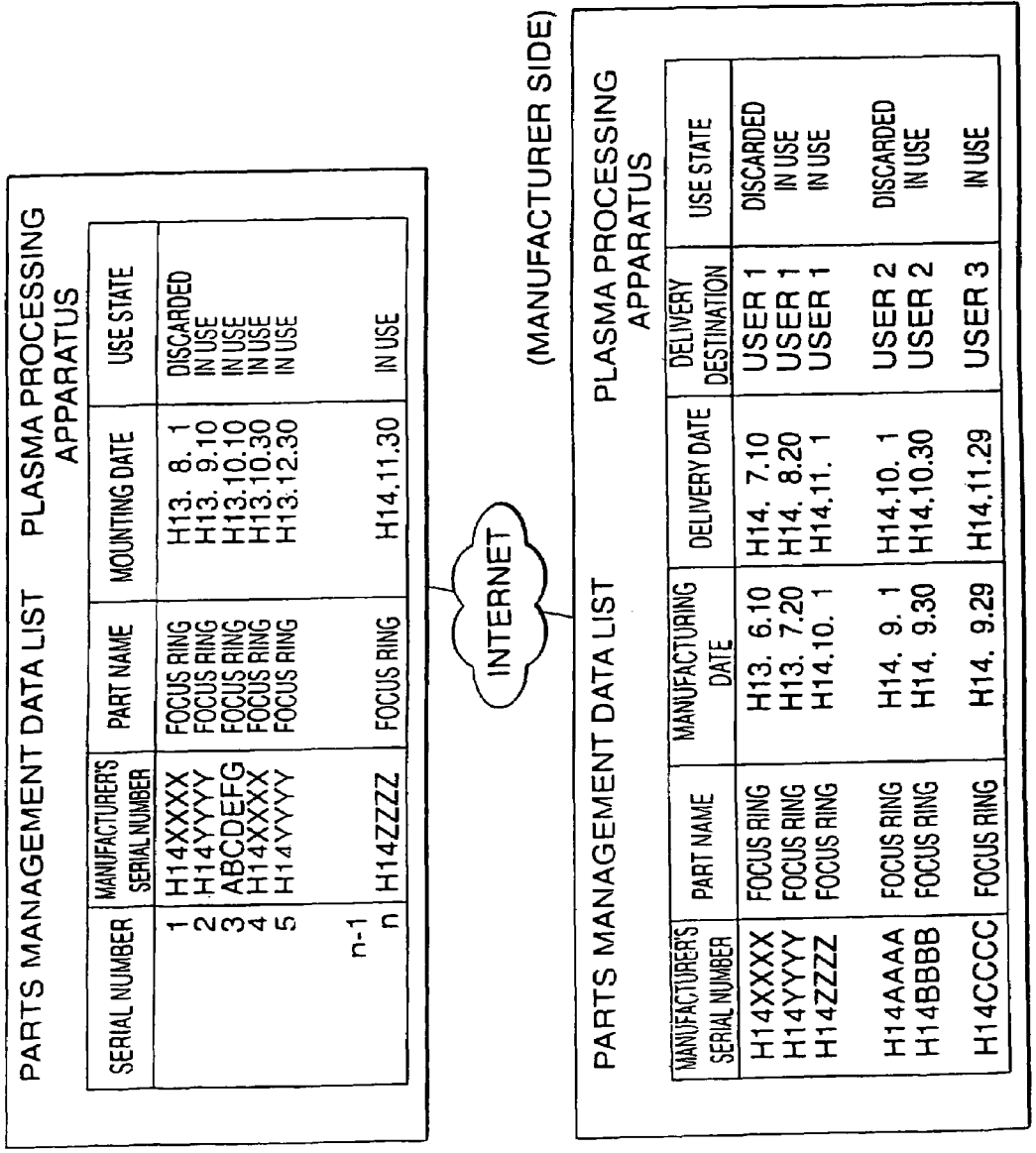
FIG. 2 is a diagram useful in explaining databases in the parts management system shown in FIG. 1.

FIG. 2 is a diagram useful in explaining the databases constructed in the parts management system shown in FIG. 1.

As shown in FIG. 2, in the parts management system shown in FIG. 1, the first database concerning management data on the parts of the product (plasma processing apparatus 11) is constructed in the computer 30 on the user side by the user 1, and a parts management data list of management data items of the parts is displayed on the display 33 on the user 1 side. The parts management data list constructed on the user 1 side has fields of a part number, a part name, a part mounting date, and a use state (management data), for each of respective manufacturer's serial numbers (ID numbers) of parts mounted in the apparatus. The user 1 enters predetermined data items in the respective fields via the keyboard 32. In each use state field is entered "in use" or "discarded". The entry "in use" in the use state field means that a part for which the entry was made has not been discarded, and therefore represents not only a state of the part in which it remains mounted in the apparatus, but also a state thereof in which it has been removed for cleaning or the like. For example, a focus ring having a part number "2" in the parts management data list on the user side was removed from the apparatus for cleaning or the like, and then mounted again in the apparatus as a focus ring having a part number "5" after completion of the cleaning. The entry "discarded" in the use state field means that a part for which the entry was made has already been out of use and discarded.

The user 1 performs entries as described above for each of individual parts, whereby the first database in the form of the parts management data list is constructed within the computer 31 on the user 1 side.

On the other hand, the parts management system shown in FIG. 1 has the second database concerning management data on the product (plasma processing apparatus 11) manufactured by the manufacturer 2, constructed in the computer 40 on the manufacturer 2 side, and a parts management data list concerning the management data on the product is displayed on the display 43 on the manufacturer 2 side. The parts management data list constructed on the manufacturer 2 side has fields of part management data items, including a part name, a part manufacturing date, a part delivery date, and a delivery destination, provided in association with the manufacturer's serial number (ID number) of each part delivered to the user. The manufacturer 2 enters predetermined data items in the respective fields using the keyboard 42. The manufacturer 2 makes entries, described above, for each part, whereby the second database in the form of the parts management data list is constructed in the computer main unit 41 on the manufacturer 2 side.

Further, the parts management system in FIG. 1 is constructed such that a cumulative service time period of each part mounted in the plasma processing apparatus 11 is measured. The cumulative service time period means a total of time periods over which a part was actually mounted in the apparatus, and therefore a time period over which the part was removed from the apparatus for cleaning or the like is excluded from the cumulative service time period.

Then, the parts management system on the manufacturer 2 side executes the parts management process described below with reference to FIGS. 3A and 3B. In the parts management process, the computer 40 on the manufacturer 2 side is connected to the computer 30 on the user 1 side via the Internet to thereby acquire management data from the first database provided in the computer main unit 31 on the user 1 side and compare the acquired data with management data in the second database on the manufacturer 2 side.

Figure 3A:
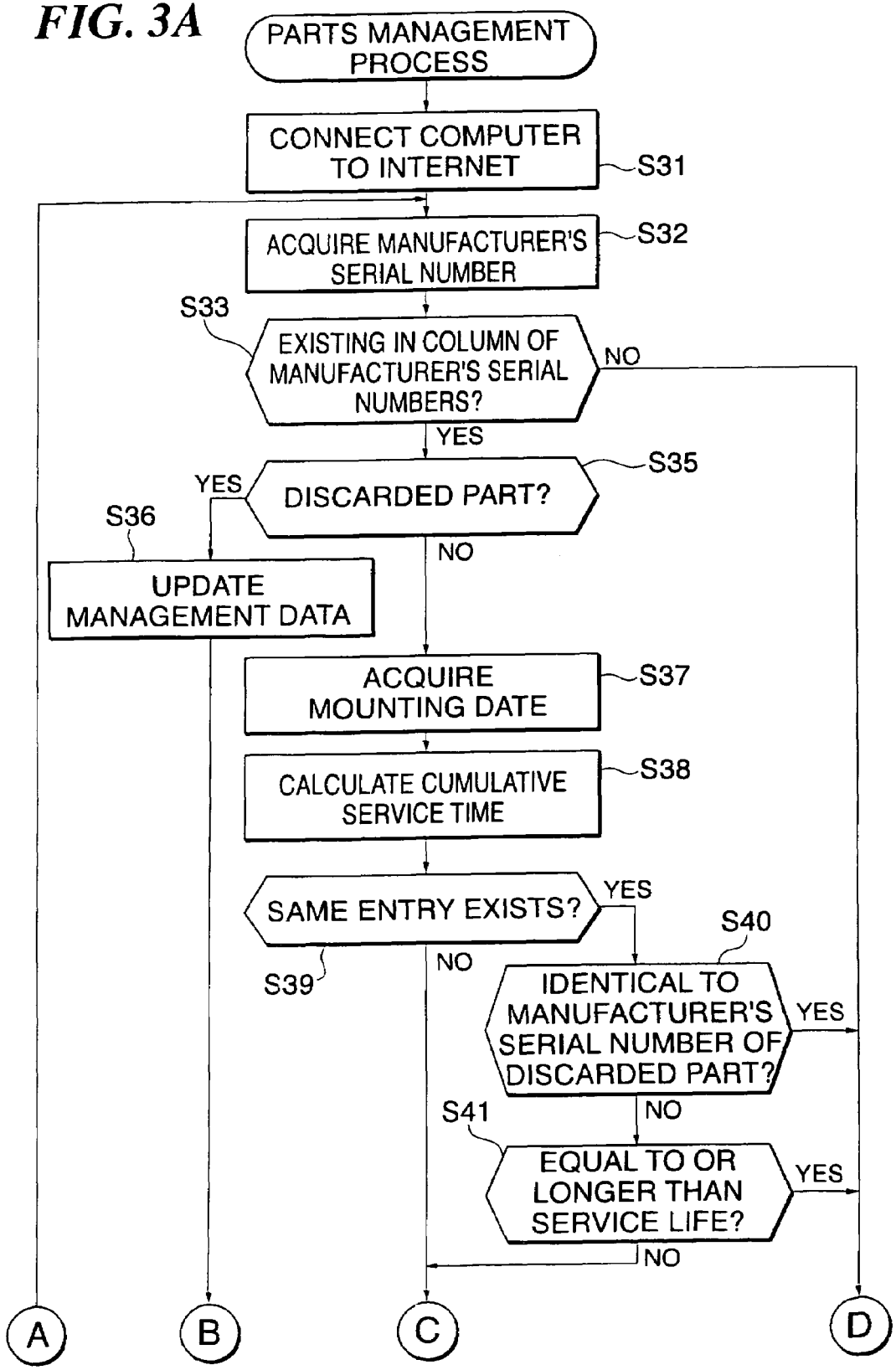

FIGS. 3A and 3B are flowchart of the parts management process executed by the parts management system on the manufacturer 2 side.

As shown in FIGS. 3A and 3B, first, the manufacturer 2 connects the computer 40 on the manufacturer 2 side to the computer 30 on the user 1 side via the Internet (step S31). This connection ensures reliable execution of parts management by the manufacturer 2. Then, the manufacturer's serial number of a predetermined part is acquired from the first database provided in the computer main unit 31 on the user 1 side, and the acquired manufacturer's serial number is displayed in a judgment table (FIG. 4) on the display 43 (step S32) (acquisition means). The manufacturer's serial number is displayed in a manufacturer's serial number field in the judgment table as shown in FIG. 4.

Then, it is determined whether or not the acquired manufacturer's serial number of the predetermined part exists in the column of manufacturer's serial numbers of the second database provided in the computer main unit 41 on the manufacturer 2 side (step S33) (comparison means). If the manufacturer's serial number of the predetermined part does not exist, it is determined that the predetermined part having the manufacturer's serial number is a non-conforming part, and a letter string "non-conforming part" is displayed in a judgment field in the judgment table in FIG. 4 (step S34), followed by the process proceeding to a step S43. The processing executed in the step S34 enables the manufacturer 2 to notice the use of a non-conforming part, such as a pirated part, by the user 1.

If the result of determination in the step S33 shows that the manufacturer's serial number of the predetermined part exists, it is determined whether or not the predetermined part has already been discarded in the first database provided in the computer main unit 31 on the user 1 side (step S35). If the predetermined part has already been discarded, the use state field of the part having the manufacturer's serial number in the management data on the second database provided in the computer main unit 41 on the manufacturer 2 side is updated from "in use" to "discarded", followed by the process proceeding to a step S44.

If the result of determination in the step S35 shows that the predetermined part has not been discarded, a mounting date thereof is acquired from the first database provided in the computer main unit 31 on the user 1 side (step S37), and the cumulative service time period of the predetermined part is calculated from the mounting date (step S38). This calculation enables the manufacturer 2 to estimate the remaining service life of the part used by the user 1, thereby ensuring more reliable execution of parts management by the manufacturer 2.

Next, it is determined whether the predetermined part is a part having once been mounted in the plasma processing apparatus 11, removed from the apparatus 11 for cleaning after a predetermined time period of use, and then mounted again in the apparatus 11, or a new part mounted in the apparatus 11 for the first time. More specifically, it is determined whether or not the management data within the first database contains the same manufacturer's serial number inputted in the past (step S39). If the same manufacturer's serial number was inputted in the past, it is further determined whether or not the manufacturer's serial number is identical to any of manufacturer's serial numbers of parts discarded in the past (step S40) (comparison means). More specifically, the manufacturer's serial number of the predetermined part is compared with that of each discarded part in the second database provided in the computer main unit 41 on the manufacturer 2 side.

If the result of determination in the step S40 shows that the same manufacturer's serial number exists, the part having the manufacturer's serial number is determined to be a non-conforming part, and the letter string "non-conforming part"

is displayed in the judgment field in the judgment table in FIG. 4 (step S34), followed by the process proceeding to the step S43.

If the result of determination in the step S40 shows that the same manufacturer's serial number does not exist, it is determined whether or not the cumulative service time period of the predetermined part calculated in the step S38 is equal to or longer the service life of the same (step S41) (comparison means).

If the result of determination in the step S41 shows that the cumulative service time period of the predetermined part is equal to or longer the service life of the same, the part is determined to be a non-conforming part, and the letter string "non-conforming part" is displayed in the judgment field in the judgment table in FIG. 4 (step S34), followed by the process proceeding to the step S43.

If the result of determination in the step S41 shows that the cumulative service time period of the predetermined part is not equal to or longer than the service life of the same, it is determined that replacement of the part was carried out for cleaning, and a letter string "conforming part" is displayed in the judgment field in the judgment table in FIG. 4 (step S42), followed by the process proceeding to the step S43.

If the result of determination in the step S39 shows that the same manufacturer's serial number was not inputted in the past, the predetermined part is determined to be a conforming part, and the letter string "conforming part" is displayed in the judgment field in the judgment table in FIG. 4 (step S42), followed by the process proceeding to the step S43.

In the step S43, the result of calculation of the cumulative service time period in the step S38 is displayed in a cumulative service time field provided in association with the predetermined part in the judgment table in FIG. 4, followed by the process proceeding to a step S44.

In the step S44, it is determined whether or not the predetermined part is the last part in the management data within the first database provided in the computer main unit 31 on the user 1 side. If it is not the last one, the process returns to the step S32 so as to perform the management process on a part inputted subsequently to the predetermined part. If the predetermined part is the last one, the process is immediately terminated.

According to the present embodiment, the computer 40 on the manufacturer 2 side connected to the computer 30 on the user 1 side via the Internet acquires management data from the first database provided in the user-side computer 30 (step S32) and compares the acquired data with the management data in the second database (step S33), which enables the manufacturer 2 to perform parts management reliably, thereby preventing use of non-conforming parts.

Further, according to the present embodiment, when the ID number of a predetermined part acquired from the first database does not exist in the second database (NO to step S33), the computer 40 on the manufacturer 2 side determines that the part is a non-conforming part, so that the manufacturer 2 can notice that the non-conforming part is used by the user 1.

According to the present embodiment, when the ID number of a predetermined part acquired from the first database exists in the second database (YES to step S33), the ID number is identical to an ID number inputted in the first database in the past (YES to step S39), and the ID number is identical to an ID number discarded in the second database in the past (YES to step S40), the computer 40 on the manufacturer 2 side determines that the part is a non-conforming part, so that the manufacturer 2 can positively notice the use of the non-conforming part by the user 1.

According to the present embodiment, when the ID number of a predetermined part acquired from the first database exists in the second database (YES to step S33), the ID number is identical to an ID number inputted in the first database in the past (YES to step S39), the ID number is not identical to any of ID numbers of parts discarded in the second database in the past (NO to step S40), and the cumulative service time period of the part acquired from the first database is equal to or longer than the service life of the part (YES to step S41), the computer 40 on the manufacturer 2 side determines that the part is a non-conforming part, so that the manufacturer 2 can more positively notice the use of the non-conforming part by the user 1.

The parts management system shown in FIG. 1 is operated as below.

FIG. 5 is a diagram useful in explaining the operation of the parts management system in FIG. 1.

As shown in FIG. 5, first, the manufacturer 2 acquires in advance management data on parts to be delivered to the user 1, to construct the second database in the computer main unit 41 (T1) as part of the manufacturer's action to be taken in a state where the user 1 is manufacturing a product. The display 43 of the manufacturer 2 displays the parts management data list of management data on parts.

Thereafter, when parts are delivered from the manufacturer 2 (T2), the user 2 enters data of the parts as management data via the keyboard 32 to construct the first database in the computer main unit 31 (T3) as part of the user's action. The display 33 of the user 1 displays the parts management data list of management data on the parts.

When the manufacturing operation is stopped due to a trouble that occurred in the plasma processing apparatus 11 for some reason (T4), in response to the user 1 contacting the manufacturer 2 (T5), the manufacturer 2 connects the computer 40 to the computer 30 on the user 1 side via the Internet so as to perform comparison between the parts management data constructed in the second database and the parts management data constructed in the first database, and executes the parts management process in FIGS. 3A and 3B (T6).

After completion of the parts management process, the manufacturer 2 notifies results of judgment displayed in the judgment table in FIG. 4 to the user 1 (T7). When there is a part determined to be a "non-conforming part", the manufacturer 2 advises the user 1 to replace the part. The user 1 replaces the part with a new one or a cleaned one (T8), whereafter the manufacturing operation is resumed.

Figure 6:
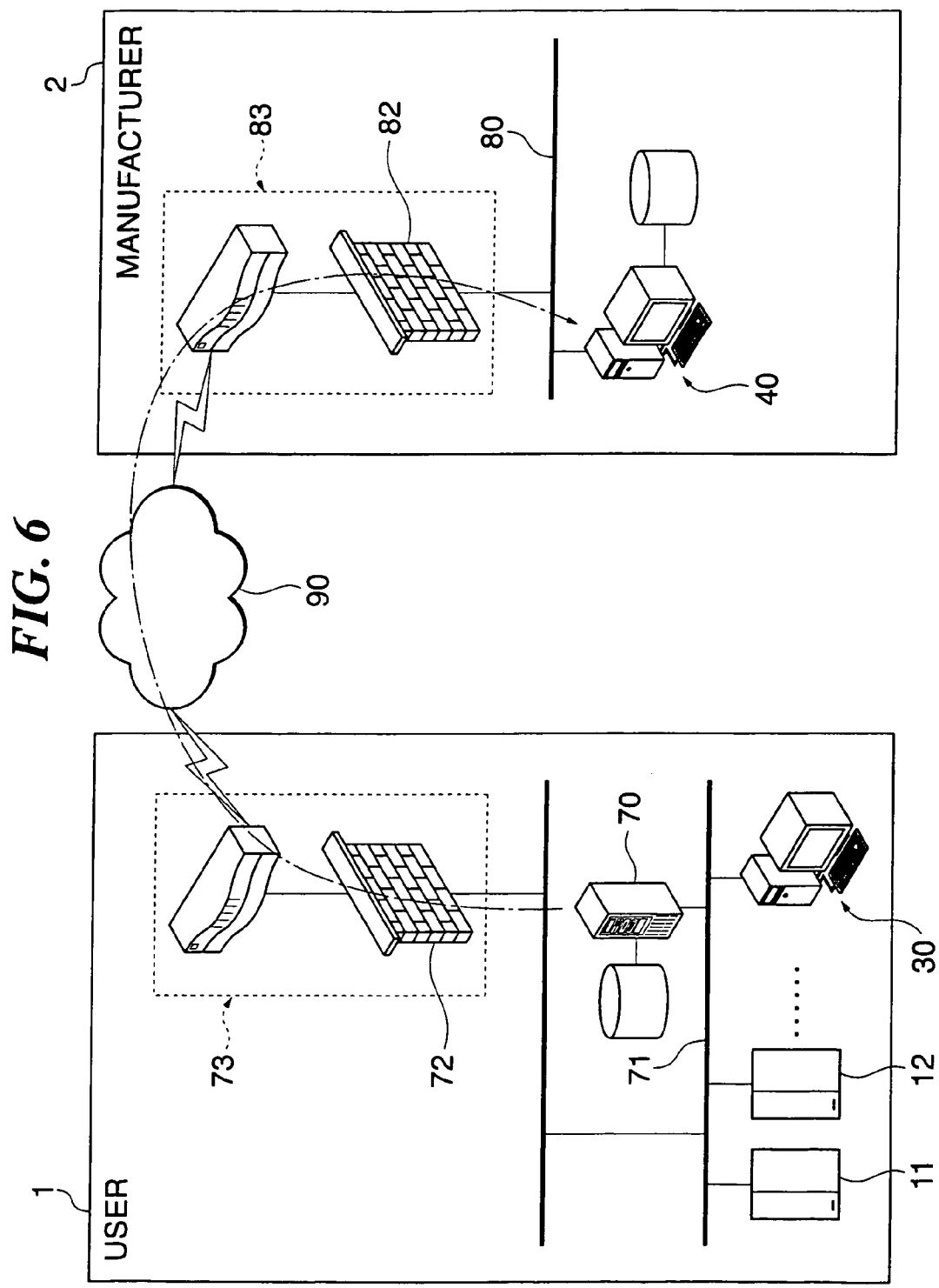
FIG. 6 is a diagram schematically showing the arrangement of a parts management system according to a variation of the parts management system shown in FIG. 1.

FIG. 6 is a diagram schematically showing the arrangement of a variation of the parts management system in FIG. 1.

In FIG. 6, component elements identical or similar to those of the parts management system in FIG. 1 are designated by identical reference numerals, and description thereof is omitted. A "first database" and a "second database" in the description below are the same as those of the parts management system in FIG. 1.

As shown in FIG. 6, a user 1 has a plurality of substrate processing apparatuses (plasma processing apparatuses) 11, 12 . . . , a single computer 30 for managing the parts of the substrate processing apparatuses 11, 12 . . . , and a server 70 in which the first database for use in managing the substrate processing apparatuses 11, 12, . . . is provided. The substrate processing apparatuses 11, 12 . . . , the computer 30, and the server 70 are interconnected via an internal network 71, such as a local area network. The user 1 further has a router 73 including a fire wall 72 connected to the internal network 71 so as to allow passage of only signals conforming to specific communication protocols. The router 73 is connected to an external network 90, such as the Internet, via a provider or the like, not shown.

On the other hand, a manufacturer 2 of the substrate processing apparatuses has a computer 40 in which the second database concerning parts of the substrate processing apparatuses 11, 12 . . . is provided, and a router 83 including a fire wall 82 that allows passage of only signals conforming to specific communication protocols. The apparatuses 11, 12, . . . , the computer 40, and the router 83 are connected to each other via an internal network 80, such as a local area network. The router 83 is connected to the external network 90, such as the Internet, via a provider or the like, not shown.

The computer 30, the server 70, the router 73, the router 83, and the computer 40 connected to each other via the external network 90 form the parts management system to manage the parts of the substrate processing apparatuses 11, 12 . . . .

The parts mentioned here are, for example, a baffle plate, a deposition shield (inner wall liner: chamber wall/in-chamber liner/deposition shield), a focus ring, a shield ring for an upper electrode, a gas shower plate for electrodes, an electrostatic chuck, a gas supply pipe, a susceptor (lower electrode), O rings, spiral rings, gaskets, an upper electrode assembly, an RF application electrode plate, a resist filter for removing impurities from a resist liquid, a carbon heater, a quartz heater, a heating lamp, an air filter, a temperature sensor, a thermocouple, a clamping ring, a quartz manifold, an end point detector, a battery, a waste gas valve, an isolation valve, a top plate window made of a dielectric for inductively coupled plasma (ICP), a bellows, a lifter pin, and a filter for a hot water circulator.

In the present variation, the manufacturer 2 may further have a server connected to the router 83 and the computer 40 via the internal network 80, such as a local area network. In this case, the second database is constructed not in the computer 40 but in the server.

In the present variation, for example, the computer 30 of the user 1 has acquisition means (other acquisition means) for acquiring the number of times of operation of an operation system of each of the substrate processing apparatuses 11, 12 . . . , which is using the parts, and is capable of executing a parts management process using the number of times of operation.

More specifically, the acquisition means acquires the number of times of operation of the operation system of each of the substrate processing apparatuses 11, 12 . . . , by using count values of an operation time counter, a driving time counter, a gas consumption counter, a discharge time counter, and so forth, or values indicative of time periods or counts of operations based on the count values of the counters.

Figure 7A:
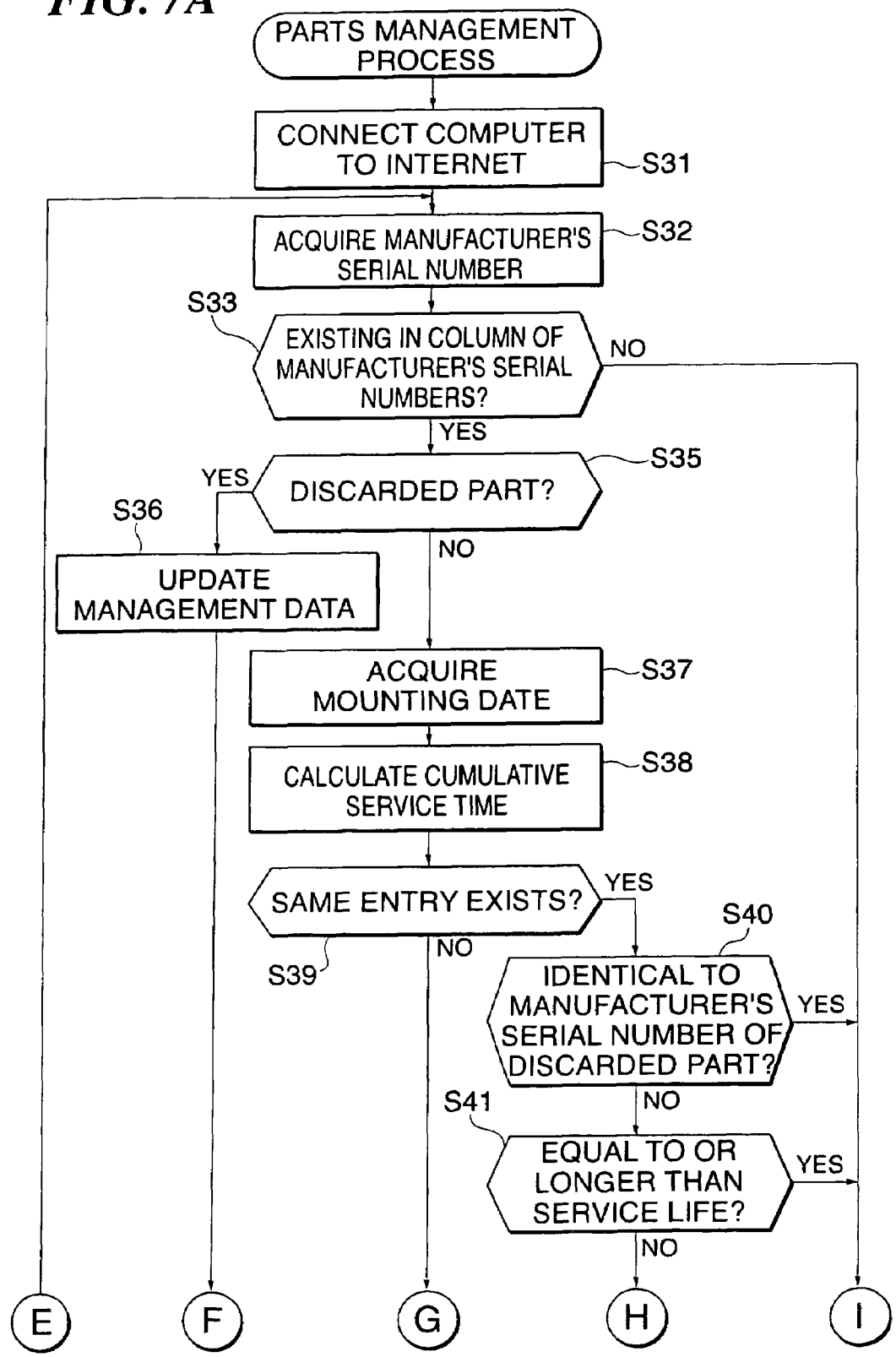

FIGS. 7A and 7B are flowchart of a parts management process executed by the parts management system in FIG. 6.

In FIGS. 7A and 7B, the same steps as in the flowchart in FIGS. 3A and 3B are designated by identical step numbers, and description thereof is omitted.

If the result of determination in the step S40 shows that the same manufacturer's serial number exists, the part having the manufacturer's serial number is determined to be a non-conforming part, and the letter string "non-conforming part" is displayed in a judgment field of the predetermined part in a judgment table in FIG. 8 (step S34), followed by the process proceeding to the step S43. On the other hand, if the result of determination in the step S40 shows that the same manufacturer's serial number does not exist, it is further determined whether or not the cumulative service time period of the predetermined part calculated in the step S38 is equal to or longer than the service life of the same (step S41) (comparison means).

If the result of determination in the step S41 shows that the cumulative service time period of the predetermined part is equal to or longer than the service life of the same, the part is determined to be a non-conforming part, and the letter string "non-conforming part" is displayed in the judgment field in the judgment table in FIG. 8 (step S34), followed by the process proceeding to the step S43. On the other hand, if the cumulative service time period of the predetermined part is not equal to or longer than the service life of the same, the process proceeds to a step S82.

When the number of times of operation of the operation system of the plasma processing apparatus 11 using the part is acquired by the computer 30 on the user 1 side via the internal network 71 (step S82) (other acquisition means), it is determined whether or not the number of times of operation using the predetermined part acquired from the first database is equal to or larger than an allowable number of times corresponding to the service life of the part (step S83) (comparison means). The number of times of operation is counted from the mounting date acquired in the step S37.

If the result of determination in the step S83 shows that the number of times of operation using the predetermined part is equal to or larger than the allowable number of times of use of the part, the part is determined to be a non-conforming part, and the letter string "non-conforming part" is displayed in the judgment field in the judgment table in FIG. 8 (step S34), followed by the process proceeding to the step S43. On the other hand, if the number of times of operation using the predetermined part is not equal to or larger than the allowable number of times of use of the part in the step S83, it is determined that the part was replaced for cleaning, and the letter string "conforming part" is displayed in the judgment field in the judgment table in FIG. 8 (step S42), followed by the process proceeding to the step S43.

According to the present process, when the ID number of a predetermined part acquired from the first database provided in the server 70 on the user 1 side exists in the second database (YES to step S33), the ID number is identical to an ID number inputted in the first database in the past (YES to step S39), the ID number is not identical to any of ID numbers of parts discarded in the second database in the past (NO to step S40), the cumulative service time period of the part acquired from the first database is not equal to or longer than the service life of the part (NO to step S41), and the number of times of operation using the predetermined part acquired from the first database is equal to or larger than the allowable number of times of use of the part (YES to step S83), the computer 40 on the manufacturer 2 side determines that the part is a non-conforming part. Therefore, the manufacturer 2 can more positively notice the use of the non-conforming part by the user 1.

The computer 40 on the manufacturer 2 side is not limited to a single one, but it may be implemented by a plurality of computers installed in respective departments and divisions of the manufacturer 2 and such computers may be interconnected through another external network and another internal network.

The external network 90 may be a closed line network, such as a WAN, a LAN or an IP-VPN, insofar as the network allows bidirectional communication between the server 70 of the user 1 and the computer 40 of the manufacturer 2, etc. Further, the communication medium may be implemented by a wire communication medium, such as an optical fiber cable conforming to the FDDI standard or the like, or a coaxial cable or a twist pair cable, conforming to the Ethernet standard, or by a wireless communication medium, such as the IEEE 802.11b, a satellite network, or the like.

It should be noted that in the above described embodiment, a storage means storing an ID number, such as a manufacturer's serial number may be attached to the body of a part, and the storage means may be connected to the computer 30 on the user 1 side to acquire the ID number from the part body.

Further, the storage means attached to the part body may store a code formed by simplifying an ID number, such as a manufacturer's serial number. The storage means storing an ID number, such as a manufacturer's serial number, or a code, is implemented e.g. by an IC, a bar code, or the like. This enables a user to acquire an ID number or a code easily.

The IC may include a high-frequency section having a CO (Voltage Controlled Oscillator), a PLL (Phase Locked Loop), a PA (Power Amplifier), and so forth integrated therein, for non-contact transmission/reception of data. The IC, ID number or code may be directly added to the part body e.g. by imprinting.

Further, for non-contact transmission/reception of an ID number or a code by the IC, such ICs may be interconnected through the network, and each connected to the internal network 71 or a portable terminal unit, such as a PDA. When the IC having the high-frequency section transmits data in a non-contact manner, one of a transmission/reception mode, a transmission-only mode, and a reception-only mode is selected as required, and a function of the high-frequency section is selected as required.

In addition, the IC operates using radio waves received from an external device as operating power, and therefor can be adapted for mounting at locations, such as the inside of a part body, the inside of the table, and the inside of the upper electrode assembly, to which normal operating power cannot be supplied directly. A package of such an IC has a footprint of approximately 4.0 mm×4.0 mm, but it is easily expectable for those skilled in the art that future technological advance will make the footprint far smaller.

A frequency band different from a frequency band used for RF application in plasma processing is selected as the transmitting frequency band for the IC. This prevents interference between the transmitting frequency for the IC and the frequency for RF application. Further, the frequency band for RF application may be selected as the receiving frequency for the IC so that the IC using radio waves as operating power can be operated only during RF application.

Furthermore, the ID number or the code may be directly added to a part body e.g. by imprinting. This makes it possible to manage parts to which an IC or a bar code cannot be attached.

Moreover, each part body may be connected to the computer 30 by any of the above-mentioned various communication media via the substrate processing apparatus. Further, an ID number, such as a manufacturer's serial number, or a code may be acquired from the storage means attached to each part body, by using a portable terminal unit, such as a PDA, which has an ID number (code) acquisition means, and then transmitted to the computer 30, thereby enabling acquisition of the ID number of each part.

Further, as another variation of the present embodiment, the parts management system shown in FIG. 6 may further include a container that is connected to the computer 40 of the manufacture 2 via the external network (communication network), and stores parts delivered to the user 1.

The container includes a detection means for detecting that a part has been taken out of the container, and a transmission means for transmitting an ID number of the part to the computer 40 of the manufacturer 2 when the detection means detects that the part has been taken out.

With this configuration of the parts management system, the detection means detects that a part has been taken out of the container, and when the detection means detects the part has been taken out, the transmission means transmits the ID number of the part to the computer 40 of the manufacture 2. Therefore, the user can obtain a part necessary for replacement from the container without delay, which makes it possible to reduce the production loss caused by stoppage of a substrate processing apparatus using the part. Further, the manufacturer 2 can obtain management data on parts from ID numbers transmitted from the container, which makes it possible to reduce the burdensome operation of constructing the database.

Further, the container may include a receiving device for receiving data indicative of delivery states of parts to be delivered to the user 1, and a display, such as an LCD, which displays the delivery states of the parts. With this configuration, it is possible to receive data indicative of a delivery state of a part, which is transmitted from a distribution company that delivers parts, and displays the data indicative of the delivery state on the display. Therefore, the user 1 can confirm the delivery state of the part without delay.

In the present embodiment, the ID number of each part is a manufacturer's serial number, but the ID number may be a character string, a numeral string, and a combination of the two, which is assigned to each apparatus according to a rule, as shown in FIG. 9. This makes it easy to identify the part. Alternatively, the ID number of each part may be a number which is a combination of a drawing number and a manufacturer's serial number, or a number which is arbitrarily assigned to each part by a user and can be uniquely defined.

Figure 10:
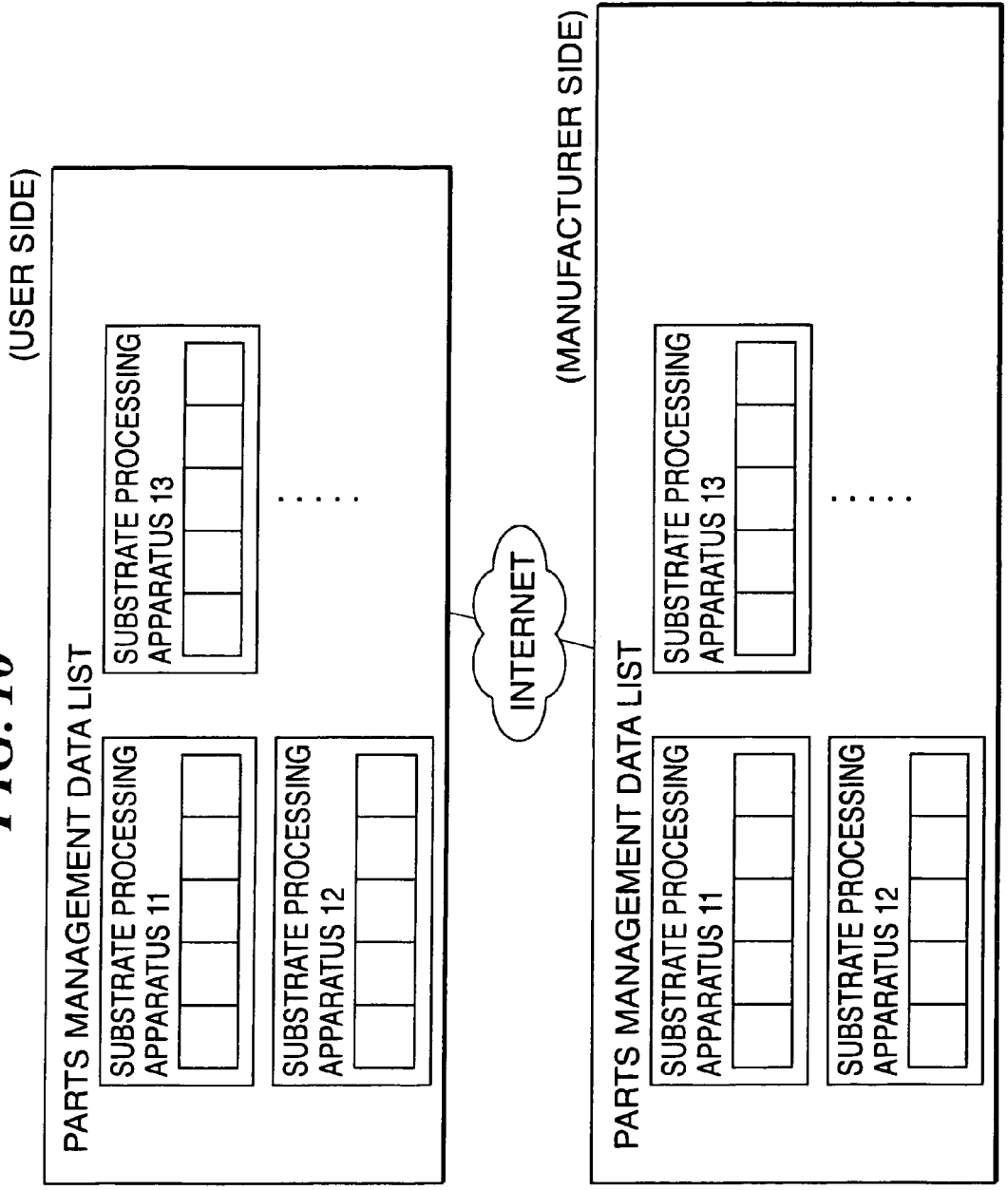
FIG. 10 is a diagram showing a variation of parts management data lists displayed, respectively, on a user's display and the manufacturer's display appearing in FIG. 2.

Further, as shown in FIG. 10, in each of the parts management data list displayed on the display of the user 1 and the parts management data list displayed on the display of the manufacturer 2, there may be displayed management data groups associated with the respective substrate processing apparatuses 11, 12, 13, 14 . . . simultaneously on the same screen. When the substrate processing apparatuses 11, 12, 13, 14 . . . are of the same model, the simultaneous display of the management data groups makes it possible to compare parts of the same kind of the substrate processing apparatuses 11, 12, 13, 14 . . . with each other and discriminate a strange part different from the others, thereby contributing to discrimination of a non-conforming part.

Although in the present embodiment, the manufacturer's computer acquires management data on parts on the user side and performs a comparison between the management data on the apparatus on the user side and the management data on the manufacturer side to thereby determine whether or not each part is a conforming one, this is not limitative, but the user's computer may have an acquisition means, a comparison means, a discrimination means, and so forth, and acquire management data on parts from the manufacturer's computer, for comparison and determination.

Further, although in the present embodiment, the management data within the first database is comprised of a manufacturer's serial number (ID number), a part number, a part name, a mounting date, and a use state, of each part, and the management data within the second database is comprised of a part name, a manufacturing date, a delivery date, and a delivery destination, according to each manufacturer's serial number (ID number), this is not limitative, but data of a version number or the like of the part may be used as a management data item.

Furthermore, when a part is determined to be a non-conforming part, the manufacturer 2 can notify the user 2 of the fact, as required, to advise the user 2 to replace the part. Moreover, the manufacturer 2 may be allowed to stop an apparatus that uses the part, or inhibit driving of the apparatus.

The substrate processing apparatuses 11, 12, 13, 14 ... are not limited to plasma processing apparatuses, but they may be thermal processing apparatuses, film deposition apparatuses, plasma etching apparatuses, in-line semiconductor processing apparatuses, or multi-chamber semiconductor processing apparatuses. Further, the substrate processing apparatuses 11, 12, 13, 14 ... may be substrate cleaning apparatuses, coating and developing apparatuses, EB (electron beam) lithography system, exposure apparatuses, ashing apparatuses, semiconductor sealing apparatuses, burn-in apparatuses, test systems, dicing apparatuses, back polishing apparatuses, CMP apparatuses, or ion implanters.

The substrate as an object to be treated may be a silicon wafer, a flat panel display (FPD) substrate, an LCD substrate, or the like.

It is to be understood that the object of the present invention can be accomplished by supplying the computer 40 or the CPU with a software program (the flowchart in FIGS. 3A and 3B or the flowchart in FIGS. 7A and 7B) which realizes the functions of any of the above described embodiment and variations, and causing the computer 40 or the CPU to read out and execute the supplied program.

In this case, the program is supplied directly from a storage medium storing the program, or downloaded from another computer, not shown, or a database, not shown, connected to the Internet, a commercial network or a local area network.

The program may be in the form of an object code, a program code which is executed by an interpreter, or script data which is supplied to an OS (operating system).

Further, it is to be understood that the object of the present invention may also be accomplished by supplying the computer or the CPU with a storage medium storing the software program that realizes the functions of any of the above described embodiment and variations, and causing the computer or the CPU to read out and execute the program stored in the storage medium.

In this case, the program code itself read from the storage medium realizes the functions of any of the above described embodiment and variations, and hence the storage medium on which the program code is stored constitutes the present invention.

Examples of the storage medium for storing the program code include a ROM, a RAM, a NV-RAM, a floppy. (registered trademark) disk, a hard disk, an optical disk (registered trademark), a magneto-optical disk, a CD-ROM, an MO,. a CD-R, a CD-RW, a DVD-ROM, a DVD-RAM, a DVD-RW, a DVD+RW, a magnetic tape, and a nonvolatile memory card. Alternatively, the program may be downloaded via a network.

Further, it is to be understood that the functions of any of the above described embodiment and variations may be accomplished not only by executing a program code read out by a computer, but also by causing an OS or the like which operates on the computer to perform a part or all of the actual operations based on instructions of the program code.

What is claimed is:

1. A parts management system comprising:
   a communication network;
   a first computer for a user, said first computer having management data on component parts for an apparatus, delivered to the user; and
   a second computer for a manufacturer, said second computer being connected to said first computer via said communication network, and having a database provided therein, the database including a list having fields for a plurality of kinds of management data for the component parts for the apparatus in association with each of ID (identification) numbers of the component parts,
   said second computer comprising:
      acquisition means for acquiring the management data on the component parts for the apparatus from said first computer via said communication network, and
      comparison means for comparing the acquired management data with the management data within the database,
   wherein said first computer has provided therein a second database of the management data on the component parts for the apparatus corresponding to the management data on the database, and said acquisition means acquires the management data from the second database via said communication network,
   wherein said comparison means comprises:
      first determination means for determining whether or not an ID number of a part acquired from the second database exists in the database,
      second determination means for determining whether or not the ID number of the part acquired from the second database is identical to an ID number that has been inputted to the second database, and
      third determination means for determining whether or not the ID number of the part acquired from the second database is identical to an ID number already discarded in the database, and
   wherein when the ID number of the part acquired from the second database exists in the database, the ID number is identical to an ID number that has been inputted to the second database, and the ID number is identical to an ID number already discarded in the database, the part is determined to be a non-conforming part.

2. A parts management system as claimed in claim 1, wherein the database in said second computer includes at least a part delivery history associated with the parts delivered to the user, as the management data.

3. A parts management system as claimed in claim 1, wherein said comparison means further comprises fourth determination means for determining whether or not a cumulative service time period of the part acquired from the second database is equal to or longer than a service life of the part, and
   wherein when the ID number of the part acquired from the second database exists in the database, the ID number is identical to any ID number that has been inputted to the second database, the ID number is not identical to any ID number already discarded in the database, and the cumulative service time period of the part acquired from the second database is equal to or longer than the service life of the part, the part is determined to be a non-conforming part.

4. A parts management system as claimed in claim 3, wherein said first computer comprises:
   second acquisition means connected via said communication network to an apparatus having an operation system in which the component parts for the apparatus are used, for acquiring a number of times of operation of the operation system of the apparatus using the parts, and
   wherein said comparison means comprises:

fifth determination means for determining whether or not the number of times of operation is equal to or larger than an allowable number of times of use of a part existing in the database, and wherein when the ID number of the part acquired from the second database exists in the database, when the ID number is identical to any ID number that has been inputted to the second database, the ID number is not identical to any ID number already discarded in the database, the cumulative service time period of the part acquired from the second database is not equal to or longer than the service life of the part, and, further the number of times of operation of the part acquired from the second database is equal to or larger than the allowable number of times of use of the part, the part is determined to be a non-conforming part.

5. A parts management system as claimed in claim 1, wherein the second database includes a list having fields for a plurality of kinds of management data for the parts in association with each of the ID numbers of the parts.

6. A parts management system as claimed in claim 1, wherein the management data in the database includes at least one of data items indicative of a part name, a manufacturing date, a delivery date, a delivery destination, a service life, and an allowable number of times of use which are associated with each of the parts.

7. A parts management system as claimed in claim 1, wherein each of said second computer and said first computer includes input means for inputting the management data on the parts.

8. A parts management system as claimed in claim 1, wherein said comparison means comprises first determination means for determining whether or not an ID number of a part acquired from the second database exists in the database, and wherein when the ID number of the part acquired from the second database does not exist in the database, said first determination means determines that the part is a non-conforming part.

9. A parts management system as claimed in claim 5, wherein the management data in the second database includes at least one of data items indicative of a part number, a part name, and a mounting date which are associated with each of the parts, and whether or not the part has been discarded.

10. A parts management system as claimed in claim 1, wherein the apparatus comprises a substrate processing apparatus.

11. A parts management system as claimed in claim 10, wherein the substrate processing apparatus is selected from the group consisting of a plasma processing apparatus, a thermal processing apparatus, a film deposition apparatus, a plasma etching apparatus, an in-line semiconductor processing apparatus, and a multi-chamber semiconductor processing apparatus.

12. A parts management system as claimed in claim 4, further comprising a container device connected to said second computer via said communication network, and containing the component parts for the apparatus already delivered to the user, and wherein said container device comprises:
    detection means for detecting that any of the component parts for the apparatus has been taken out from the container device, and
    transmission means operable when said detection means detects that any of the component parts has been taken out, to transmit an ID number of the taken out part to said second computer.

13. A parts management system comprising:
a communication network;
a first computer for a user, said first computer having management data on component parts for an apparatus, delivered to the user; and
a second computer for a manufacturer, said second computer being connected to said first computer via said communication network, and having a database provided therein, the database including a list having fields for a plurality of kinds of management data for the component parts for the apparatus in association with each of ID (identification) numbers of the component parts,
said second computer comprising:
    acquisition means for acquiring the management data on the component parts for the apparatus from said first computer via said communication network, and
    comparison means for comparing the acquired management data with the management data within the database,
wherein said first computer acquires the management data on the component parts for the apparatus from an IC (integrated circuit) attached to the part, the IC includes a high-frequency section for non-contact transmission/reception of data, and a frequency band different from a frequency band used for RF application in plasma processing is selected as the transmitting frequency band for the IC.

14. A parts management method of performing parts management using a second computer for a manufacturer, the second computer being connected to a first computer for a user, which has management data on component parts for an apparatus delivered to the user, via a communication network, and having a database provided therein, the database including a list having fields for a plurality of kinds of management data for the component parts for the apparatus in association with each of ID (identification) numbers of the component parts, the parts management method comprising:
    an acquisition step of acquiring the management data on the component parts for the apparatus from the first computer via the communication network; and
    a comparison step of comparing the acquired management data with the management data within the database,
    wherein the first computer has provided therein a second database of the management data on the component parts for the apparatus corresponding to the management data on the database, and said acquisition step comprises acquiring the management data from the second database via the communication network,
    wherein said comparison step comprises:
        a first determination step of determining whether or not an ID number of the part acquired from the second database exists in the database,
        a second determination step of determining whether or not the ID number of a part acquired from the second database is identical to an ID number that has been inputted in the second database, and
        a third determination step of determining whether or not the ID number of the part acquired from the second database is identical to an ID number already discarded in the database, and
    wherein the parts management method further comprises a determination step of determining that the part is determined to be a non-conforming part, when it is determined in said first determination step that the ID number of the part acquired from the second database exists in the database, in said second determination step that the ID number is identical to an ID number that has been inputted to the second database, and in said third determination step that the ID number is identical to an ID number already discarded in the database.

15. A parts management method as claimed in claim 14, wherein the apparatus comprises a substrate processing apparatus.

16. A parts management method as claimed in claim 15, wherein the substrate processing apparatus is selected from the group consisting of a plasma processing apparatus, a thermal processing apparatus, a film deposition apparatus, a plasma etching apparatus, an in-line semiconductor processing apparatus, and a multi-chamber semiconductor processing apparatus.

17. A parts management method as claimed in claim 14, wherein the database in the second computer includes at least a part delivery history associated with the parts delivered to the user, as the management data.

18. A parts management method as claimed in claim 14, wherein said comparison step comprises a first determination step of determining whether or not an ID number of a part acquired from the second database exists in the database, and
wherein when it is determined in said first determination step that the ID number of the part acquired from the second database does not exist in the database, the part is determined to be a non-conforming part.

19. A parts management method as claimed in claim 14, wherein the second database includes a list having fields for a plurality of kinds of management data for the parts in association with each of the ID numbers of the parts.

20. A parts management method as claimed in claim 19, wherein the management data in the second database includes at least one of data items indicative of a part number, a part name, and a mounting date which are associated with each of the parts, and whether or not the part has been discarded.

21. A parts management method as claimed in claim 14, wherein the management data in the database includes at least one of data items indicative of a part name, a manufacturing date, a delivery date, a delivery destination, a service life, and an allowable number of times of use which are associated with each of the parts.

22. A parts management method as claimed in claim 14, comprising an input step of inputting the management data on the parts by each of the second computer and the first computer.

23. A parts management method as claimed in claim 14, wherein said comparison step further comprises a fourth determination step of determining whether or not a cumulative service time period of the part acquired from the second database is equal to or longer than a service life of the part, and
wherein the parts management method comprises a determination step of determining that the part is a non-conforming part, when it is determined in said first determination step that the ID number of the part acquired from the second database exists in the database, in said second determination step that the ID number is not identical to any ID number inputted to the second database in the past, in said third determination step that the ID number is not identical to any ID number already discarded in the database, and in said fourth determination step that the cumulative service time period of the part acquired from the second database is equal to or longer than the service life of the part.

24. A parts management method as claimed in claim 23, wherein the first computer is connected to the apparatus via the communication network, and
wherein said comparison step further comprises
a fifth determination step of determining whether or not a number of times of operation of an operation system of the apparatus is equal to or larger than an allowable number of times of use of a part existing in the database, and wherein the parts management method further comprises:
a second acquisition step of acquiring the number of times of operation of the operation system of the apparatus, and
a determination step of determining that the part is a non-conforming part, when it is determined in said first determination step that the ID number of the part acquired from the second database exists in the database, in said second determination step that the ID number is not identical to any ID number that has been inputted to the second database, in said third determination step that the ID number is not identical to any ID number already discarded in the database, in said fourth determination step that the cumulative service time period of the part acquired from the second database is not equal to or longer than the service life of the part, and, further, in said fifth determination step that the number of times of operation of the part acquired from the second database in said second acquisition step is equal to or larger than the allowable number of times of use of the part.

25. A parts management method as claimed in claim 23, further comprising a containing step of containing the component parts for the apparatus already delivered to the user, in a container device connected to the second computer via the communication network, and
wherein said containing step comprises:
a detection step of detecting that any of the component parts for the apparatus has been taken out from the container device, and
a transmission step of transmitting an ID number of a part of the component parts that has been taken out, to the second computer, when in said detection step, it is detected that the part of the component parts has been taken out.

26. A parts management method of performing parts management using a second computer for a manufacturer, the second computer being connected to a first computer for a user, which has management data on component parts for an apparatus delivered to the user, via a communication network, and having a database provided therein, the database including a list having fields for a plurality of kinds of management data for the component parts for the apparatus in association with each of ID (identification) numbers of the component parts, the parts management method comprising:
an acquisition step of acquiring the management data on the component parts for the apparatus from the first computer via the communication network; and
a comparison step of comparing the acquired management data with the management data within the database,
wherein the first computer acquires the management data on the component parts for the apparatus from an IC (integrated circuit) attached to each of the parts, the integrated circuit includes a high-frequency section for non-contact transmission/reception of data, and a frequency band different from a frequency band used for RF application in plasma processing is selected as the transmitting frequency band for the IC.

27. A parts management program for causing a second computer for a manufacturer to perform a parts management method, the second computer being connected to a first computer for a user, which has management data on component parts for an apparatus, delivered to the user, via a communication network, and having a database provided therein, the database including a list having fields for a plurality of kinds of management data for the component parts for the apparatus in association with each of ID (identification) numbers of the component parts for the apparatus, the parts management program comprising:

an acquisition module for acquiring the management data on the component parts for the apparatus from the first computer via the communication network; and a comparison module for comparing the acquired management data with the management data within the database, wherein the first computer has provided therein a second database of the management data on the component parts for the apparatus corresponding to the management data on the database, and said acquisition module acquires the management data from the second database via the communication network, wherein said comparison module comprises:

a first determination module for determining whether or not an ID number of the part acquired from the second database exists in the database, a second determination module for determining whether or not the ID number of a part acquired from the second database is identical to an ID number that has been inputted in the second database, and a third determination module for determining whether or not the ID number of the part acquired from the second database is identical to an ID number already discarded in the database, and wherein the parts management program further comprises a determination module for determining that the part is determined to be a non-conforming part, when it is determined by said first determination module that the ID number of the part acquired from the second database exists in the database, by said second determination module that the ID number is identical to an ID number that has been inputted to the second database, and by said third determination module that the ID number is identical to an ID number already discarded in the database.

28. A computer-readable storage medium storing a parts management program as claimed in claim 27.

29. A parts management program for causing a second computer for a manufacturer to perform a parts management method, the second computer being connected to a first computer for a user, which has management data on component parts for an apparatus, delivered to the user, via a communication network, and having a database provided therein, the database including a list having fields for a plurality of kinds of management data for the component parts for the apparatus in association with each of ID (identification) numbers of the component parts for the apparatus, the parts management program comprising:

an acquisition module for acquiring the management data on the component parts for the apparatus from the first computer via the communication network; and a comparison module for comparing the acquired management data with the management data within the database, wherein the first computer acquires the management data on the component parts for the apparatus from an IC (integrated circuit) attached to the part, the IC includes a high-frequency section for non-contact transmission/reception of data, and a frequency band different from a frequency band used for RF application in plasma processing is selected as the transmitting frequency band for the IC.

30. A computer-readable storage medium storing a parts management program as claimed in claim 29.

* * * * *